US012592194B2

(12) United States Patent
Miyamoto

(10) Patent No.: US 12,592,194 B2
(45) Date of Patent: Mar. 31, 2026

(54) DISPLAY DEVICE

(71) Applicant: Sharp Display Technology Corporation, Kameyama City (JP)

(72) Inventor: Tadayoshi Miyamoto, Kameyama City (JP)

(73) Assignee: Sharp Display Technology Corporation, Kameyama City (JP)

(*) Notice: Subject to any disclaimer, the term of this patent is extended or adjusted under 35 U.S.C. 154(b) by 0 days.

(21) Appl. No.: 18/865,763

(22) PCT Filed: Jul. 11, 2022

(86) PCT No.: PCT/JP2022/027276
§ 371 (c)(1),
(2) Date: Nov. 14, 2024

(87) PCT Pub. No.: WO2024/013808
PCT Pub. Date: Jan. 18, 2024

(65) Prior Publication Data
US 2025/0356803 A1     Nov. 20, 2025

(51) Int. Cl.
*G09G 3/3233*          (2016.01)
*H10K 59/121*          (2023.01)

(52) U.S. Cl.
CPC ....... *G09G 3/3233* (2013.01); *H10K 59/1213* (2023.02); *G09G 2300/0842* (2013.01); *G09G 2330/021* (2013.01)

(58) Field of Classification Search
CPC ......... G09G 3/3233; G09G 2300/0842; G09G 2330/02; H10K 59/1213
See application file for complete search history.

(56) References Cited

U.S. PATENT DOCUMENTS

| | | |
|---|---|---|
| 2015/0053935 A1 | 2/2015 | Gupta et al. |
| 2015/0054799 A1 | 2/2015 | Chang et al. |
| 2015/0055047 A1 | 2/2015 | Chang et al. |
| 2015/0055051 A1 | 2/2015 | Osawa et al. |
| 2018/0033805 A1 | 2/2018 | Gupta et al. |
| 2018/0122835 A1 | 5/2018 | Watakabe et al. |
| 2019/0006394 A1 | 1/2019 | Gupta et al. |
| 2019/0250443 A1 | 8/2019 | Watakabe et al. |
| 2020/0075636 A1 | 3/2020 | Gupta et al. |
| 2020/0335528 A1 | 10/2020 | Gupta et al. |

(Continued)

FOREIGN PATENT DOCUMENTS

| | | |
|---|---|---|
| JP | 2016-534390 A | 11/2016 |
| JP | 2018-074076 A | 5/2018 |

(Continued)

*Primary Examiner* — Stacy Khoo
(74) *Attorney, Agent, or Firm* — ScienBiziP, P.C.

(57)          ABSTRACT

In a CMOS circuit provided as part of a drive circuit in a frame region, a second TFT including a second semiconductor layer formed of an oxide semiconductor includes a first gate electrode provided on one surface side of the second semiconductor layer with a first inorganic insulating film interposed therebetween, and a second gate electrode provided on the other surface side of the second semiconductor layer with a second inorganic insulating film interposed therebetween. The second TFT is configured to apply a negative voltage to the second gate electrode during an off period in which no voltage is applied to the first gate electrode.

11 Claims, 13 Drawing Sheets

(56)  References Cited

U.S. PATENT DOCUMENTS

| 2020/0402910 A1 * | 12/2020 | Kakehata ......... H01L 21/76865 |
| 2021/0091083 A1 | 3/2021 | Kato |
| 2021/0225890 A1 | 7/2021 | Osawa et al. |
| 2022/0037374 A1 | 2/2022 | Gupta et al. |
| 2023/0154931 A1 | 5/2023 | Osawa et al. |
| 2024/0128274 A1 | 4/2024 | Gupta et al. |
| 2024/0412691 A1 * | 12/2024 | Yuan ................... G09G 3/3233 |

FOREIGN PATENT DOCUMENTS

| JP | 2018-195824 A | 12/2018 |
| JP | 2020-017558 A | 1/2020 |

* cited by examiner

DISPLAY DEVICE

TECHNICAL FIELD

The disclosure relates to a display device.

BACKGROUND ART

In recent years, as a display device replacing a liquid crystal display device, a self-luminous organic electroluminescence (hereinafter also referred to as "EL") display device using organic EL elements has attracted attention. In the organic EL display device, a plurality of thin film transistors (hereinafter also referred to as "TFTs") are provided for each subpixel that is the smallest unit of an image. Well-known examples of a semiconductor layer included in the TFT include a semiconductor layer made of polysilicon having high mobility, and a semiconductor layer made of an oxide semiconductor with a low leakage current such as In—Ga—Zn—O.

For example, JP 2020-17558 A discloses a display device having a hybrid structure in which a first TFT using a polysilicon semiconductor and a second TFT using an oxide semiconductor are formed on a substrate.

SUMMARY

Technical Problem

Incidentally, with respect to an organic EL display device having a hybrid structure, it has been proposed to provide, as a part of a drive circuit, a complementary metal oxide semiconductor (CMOS) circuit in which a P-channel TFT using a polysilicon semiconductor and an N-channel TFT using an oxide semiconductor are combined. However, in an organic EL display device including the CMOS circuit, even when the N-channel TFT using the oxide semiconductor is in an off state, if the voltage between a source electrode and a drain electrode is high, a drain current flows due to generation of hot carriers, and characteristics of the N-channel TFT are likely to deteriorate. Thus, there is room for improvement.

The disclosure has been made in view of the point described above, and an object of the disclosure is to suppress a deterioration in characteristics in an off state of an N-channel thin film transistor that uses an oxide semiconductor.

In order to achieve the object described above, a display device according to the disclosure includes a base substrate, and a thin film transistor layer provided on the base substrate, in which a first thin film transistor formed of polysilicon and including a first semiconductor layer and a second thin film transistor formed of an oxide semiconductor and including a second semiconductor layer are disposed. In the display device, a display region in which an image is displayed and a frame region surrounding the display region are defined. A complementary metal oxide film semiconductor circuit obtained by combining the first thin film transistor and the second thin film transistor is provided in the frame region as a part of a drive circuit. The second thin film transistor in the complementary metal oxide film semiconductor circuit includes a first gate electrode provided on one surface side of the second semiconductor layer with a first inorganic insulating film interposed between the first gate electrode and the second semiconductor layer, and a second gate electrode provided on another surface side of the second semiconductor layer with a second inorganic insulating film interposed between the second gate electrode and the second semiconductor layer. A negative voltage is applied to the second gate electrode during an off period in which no voltage is applied to the first gate electrode.

Advantageous Effects of Disclosure

According to the disclosure, it is possible to suppress a deterioration in characteristics in an off state of an N-channel thin film transistor that uses an oxide semiconductor.

DESCRIPTION OF EMBODIMENTS

Embodiments of the disclosure will be described below in detail with reference to the drawings. Note that the disclosure is not limited to the embodiments to be described below.

First Embodiment

Figure 1:
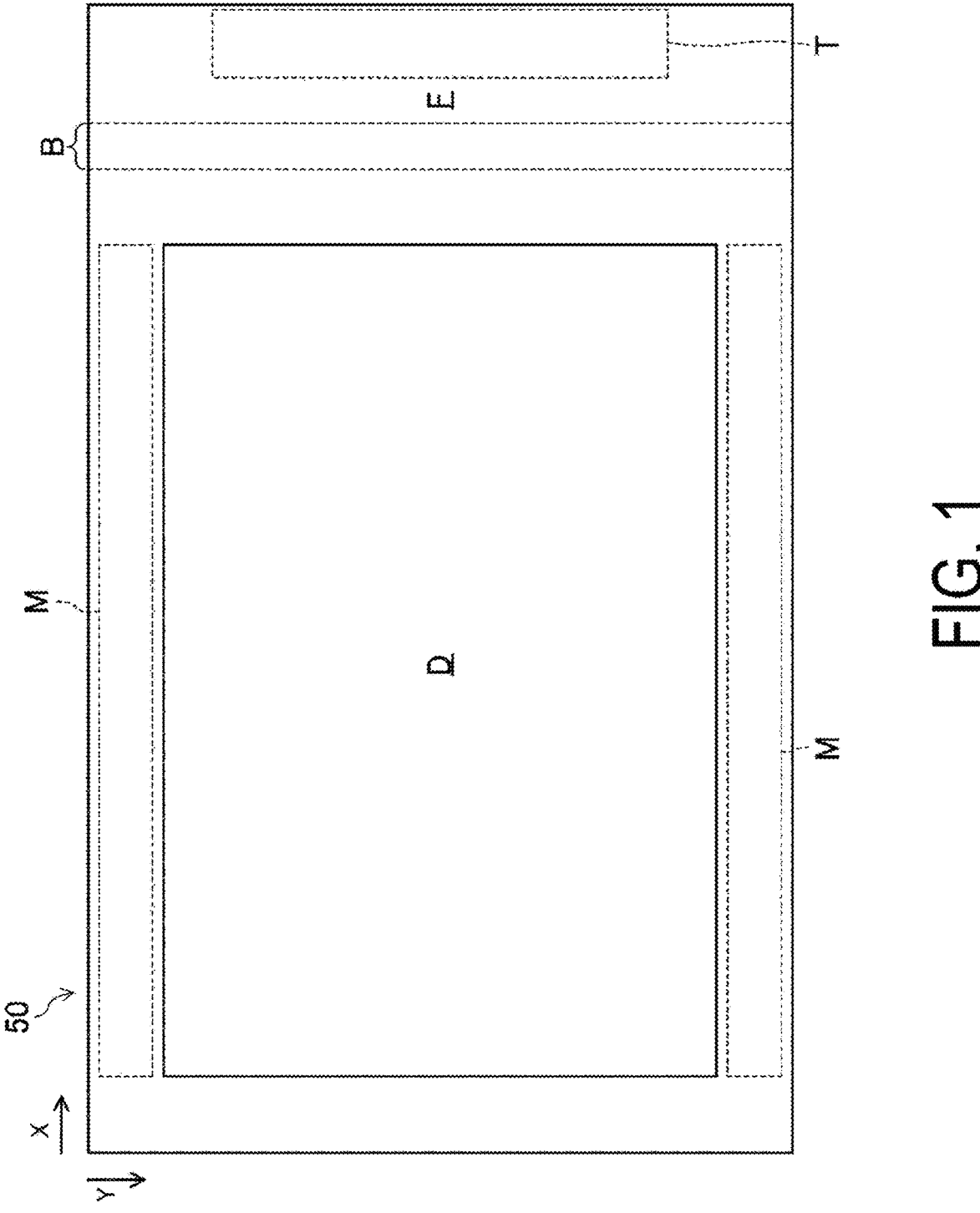
FIG. 1 is a plan view illustrating a schematic configuration of an organic EL display device according to a first embodiment of the disclosure.
Figure 2:
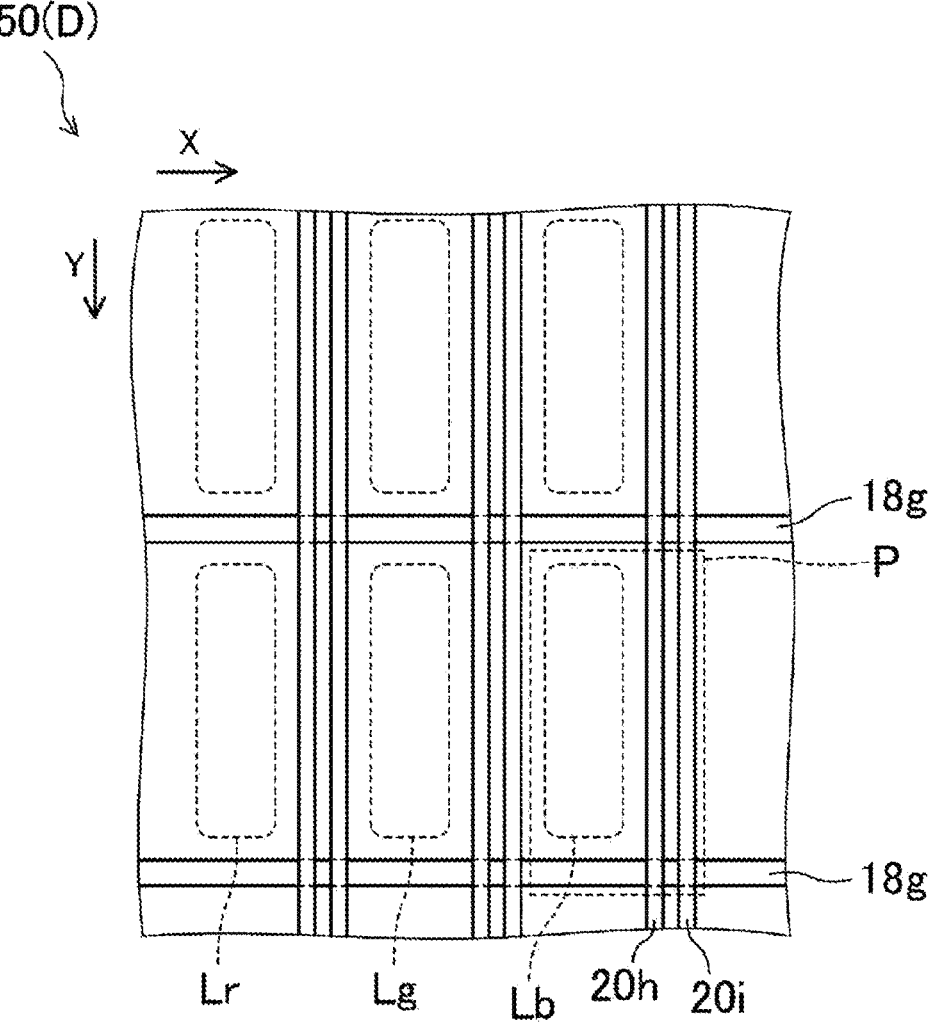
FIG. 2 is a plan view of a display region of the organic EL display device according to the first embodiment of the disclosure.
Figure 3:
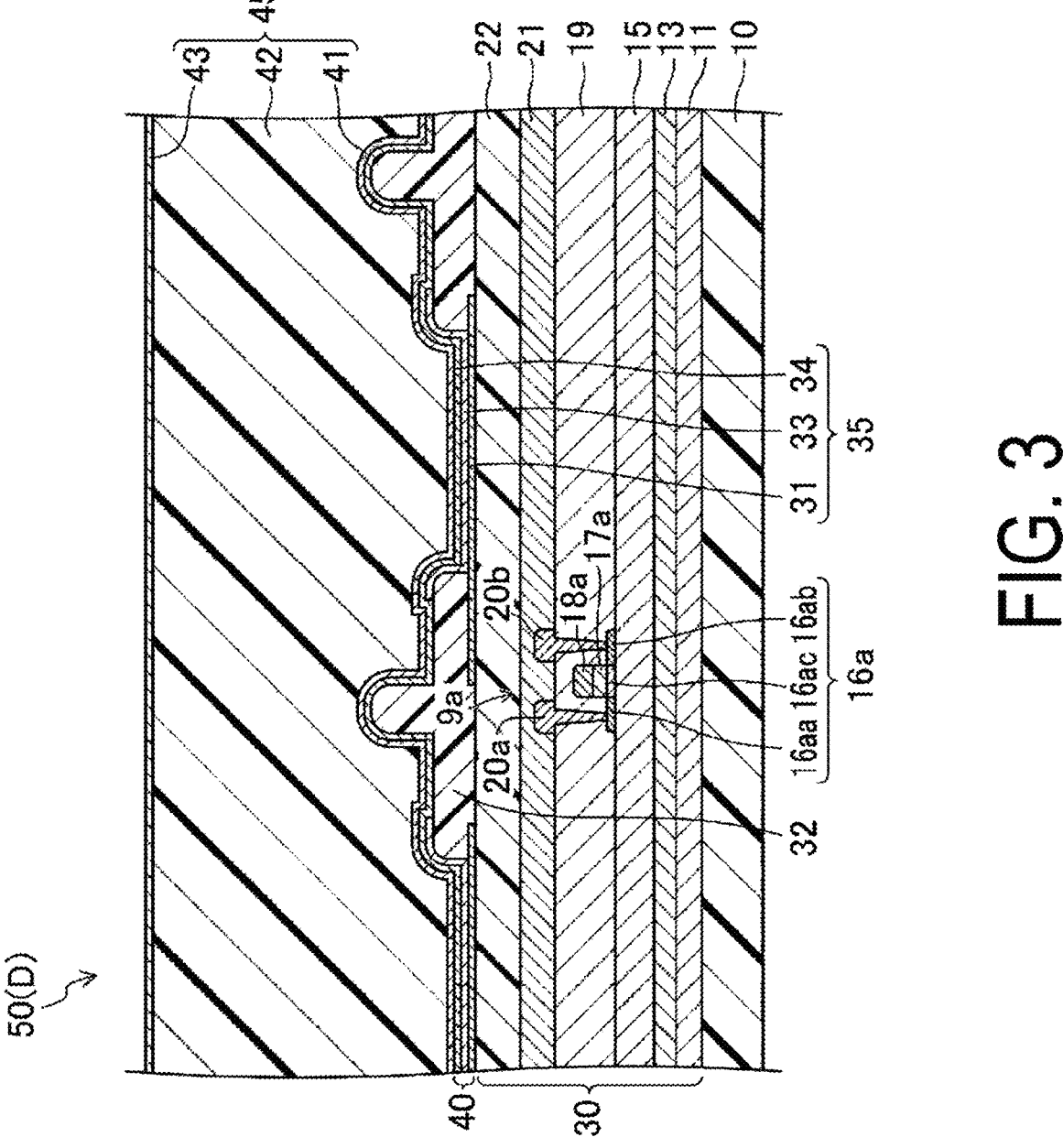
FIG. 3 is a cross-sectional view of the display region of the organic EL display device according to the first embodiment of the disclosure.
Figure 4:
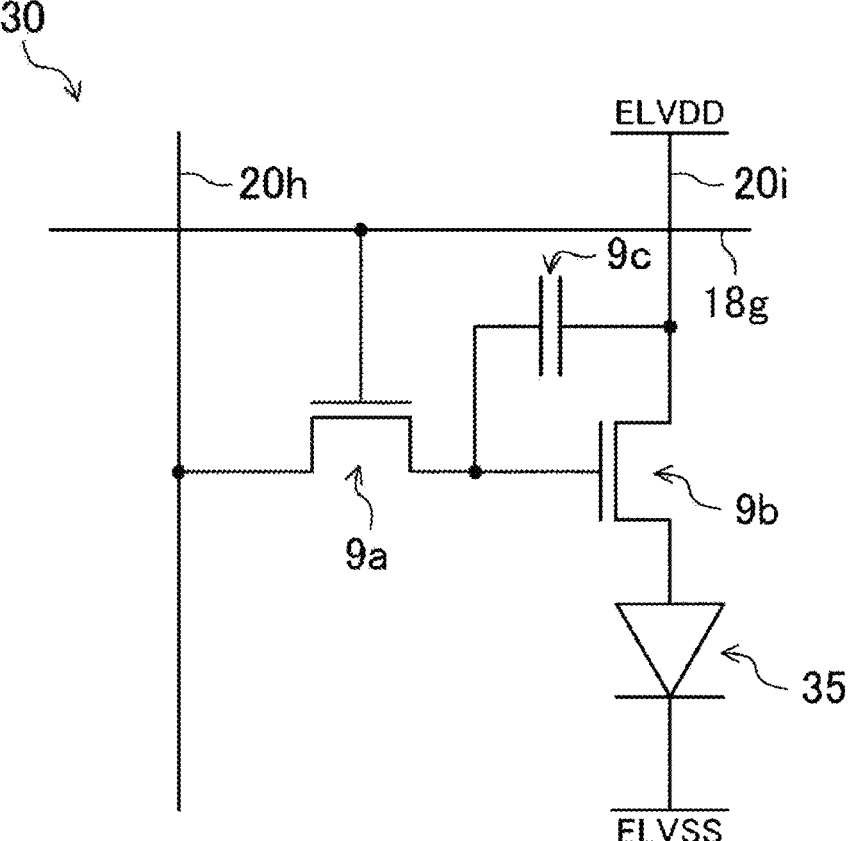
FIG. 4 is an equivalent circuit diagram of a thin film transistor layer included in the organic EL display device according to the first embodiment of the disclosure.
Figure 5:
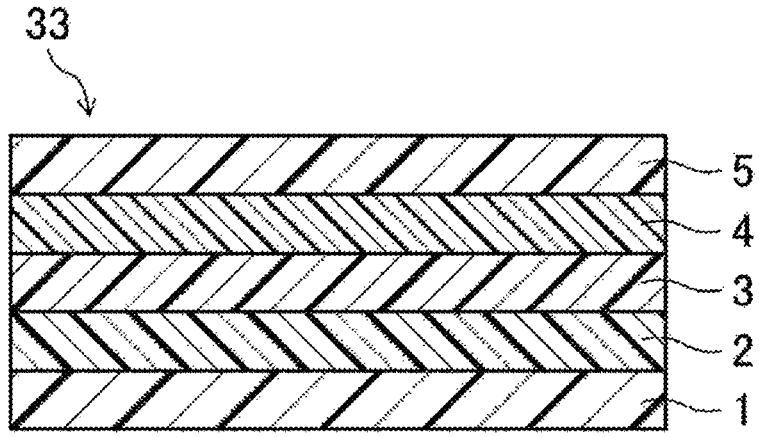
FIG. 5 is a cross-sectional view illustrating an organic electroluminescence layer included in the organic EL display device according to the first embodiment of the disclosure.
Figure 6:
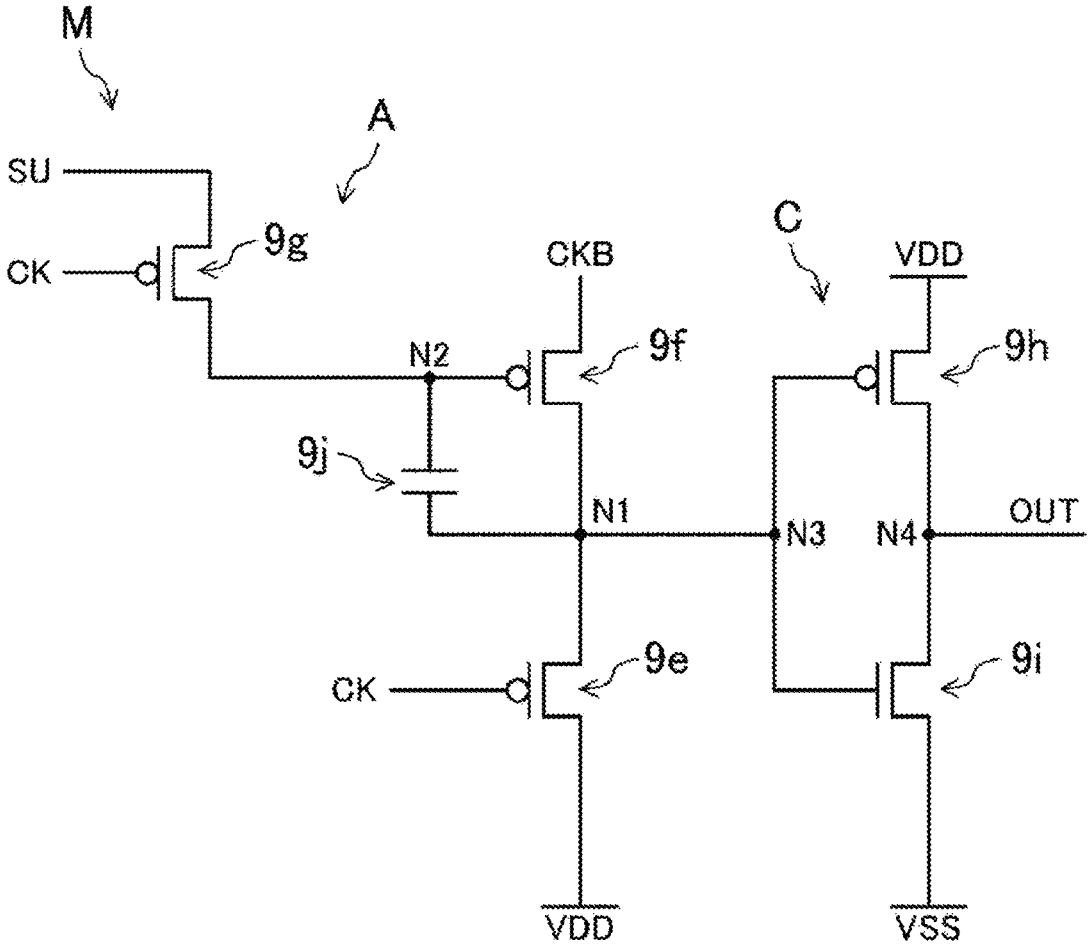
FIG. 6 is an equivalent circuit diagram illustrating a drive circuit including a complementary metal oxide film semiconductor circuit included in the organic EL display device according to the first embodiment of the disclosure.
Figure 7:
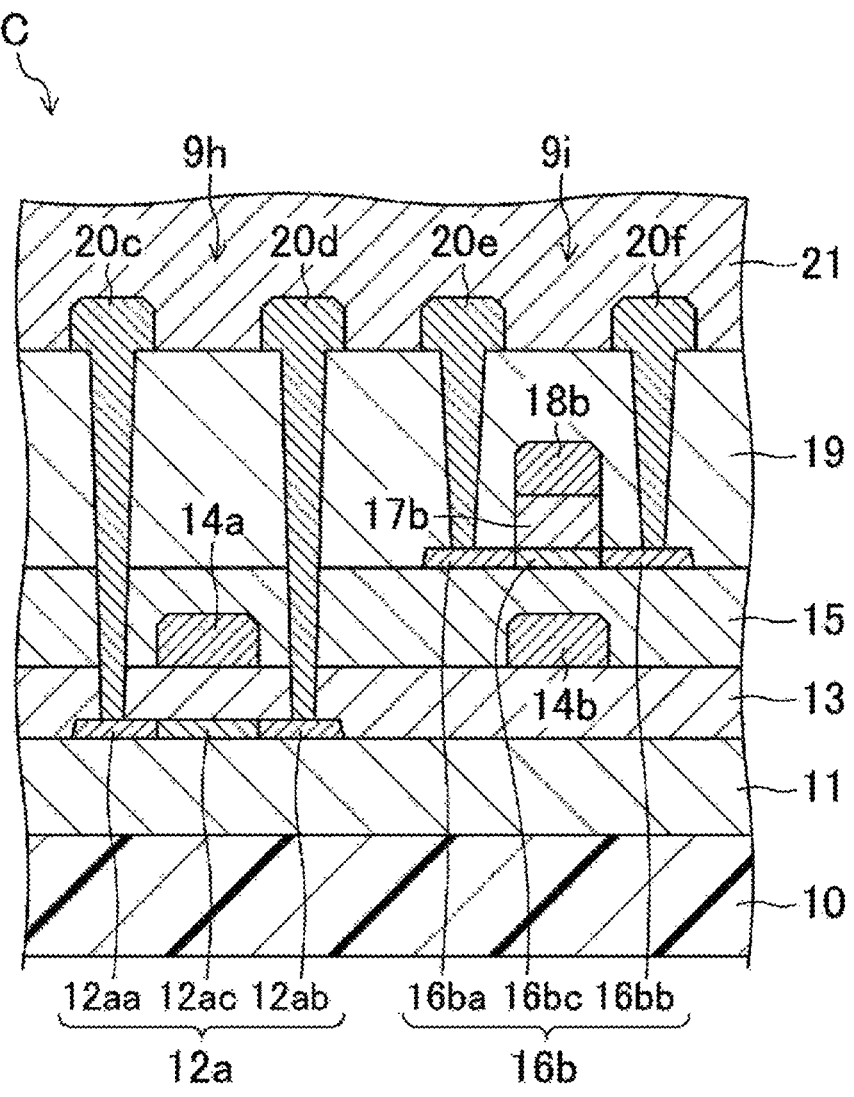
FIG. 7 is a cross-sectional view of the complementary metal oxide film semiconductor circuit included in the organic EL display device according to the first embodiment of the disclosure.
Figure 8:
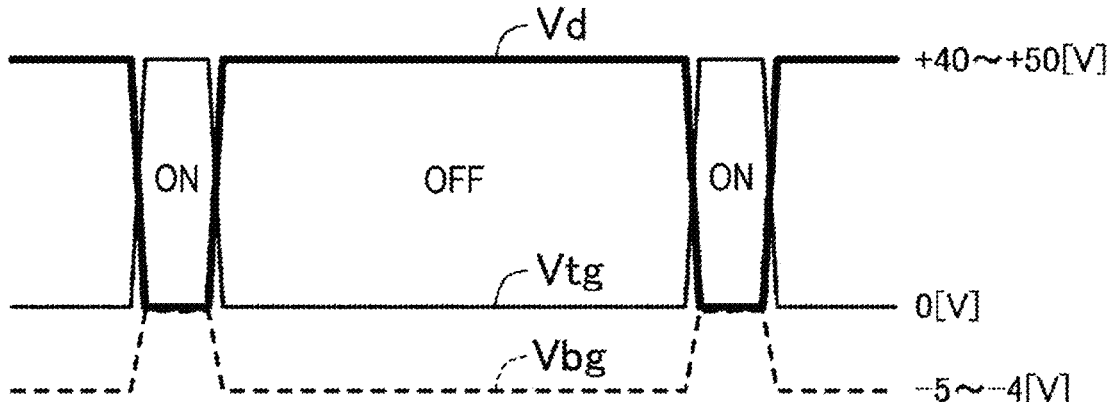
FIG. 8 is a voltage waveform diagram illustrating a driving operation of a second thin film transistor included in the complementary metal oxide film semiconductor circuit of the organic EL display device according to the first embodiment of the disclosure.

FIGS. 1 to 12 illustrate a first embodiment of a display device according to the disclosure. Note that, in each of the following embodiments, an organic EL display device including an organic EL element layer is exemplified as a display device including a light-emitting element layer. Here, FIG. 1 is a plan view illustrating a schematic configuration of an organic EL display device 50 according to the present embodiment. FIGS. 2 and 3 are a plan view and a cross-sectional view, respectively, of a display region D in the organic EL display device 50. FIG. 4 is an equivalent circuit diagram of a TFT layer 30 included in the organic EL display device 50. FIG. 5 is a cross-sectional view illustrating an organic EL layer 33 included in the organic EL display device 50. FIG. 6 is an equivalent circuit diagram illustrating a gate driver circuit M including a CMOS circuit C included in the organic EL display device 50. FIG. 7 is a cross-sectional view of the CMOS circuit C included in the organic EL display device 50. FIG. 8 is a voltage waveform diagram illustrating a driving operation of a fifth peripheral TFT 9i included in the CMOS circuit C of the organic EL display device 50.

As illustrated in FIG. 1, the organic EL display device 50 includes, for example, the display region D that is provided in a rectangular shape and displays an image, and a frame region F provided in a frame-like shape surrounding the display region D. Note that, in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch.

As illustrated in FIG. 2, a plurality of subpixels P are arrayed in a matrix shape in the display region D. In the display region D, for example, a subpixel P including a red light-emitting region Lr for displaying a red color, a subpixel P including a green light-emitting region Lg for displaying a green color, and a subpixel P including a blue light-emitting region Lb for displaying a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D.

A terminal portion T is provided extending in one direction (Y direction in the drawing) at a right end portion of the frame region F in FIG. 1. As illustrated in FIG. 1, between the display region D and the terminal portion T, that is, in the frame region F, a bending portion B, which is bendable, for example, by 180 degrees (in a U-shape) with the Y direction in the drawing as a bending axis, is provided extending in one direction (Y direction in the drawing) on the display region D side of the terminal portion T. The gate driver circuits M are provided as drive circuits at an upper end portion and a lower end portion of the frame region F in FIG. 1. Note that, in the frame region F, as will be described later, the CMOS circuit C in which a fourth peripheral TFT 9h and the fifth peripheral TFT 9i are combined is provided as a part of the gate driver circuit M.

As illustrated in FIG. 3, the organic EL display device 50 includes a resin substrate 10 provided as a base substrate, the TFT layer 30 provided on the resin substrate 10, an organic EL element layer 40 provided on the TFT layer 30 as a light-emitting element layer, and a sealing film 45 provided on the organic EL element layer 40.

The resin substrate 10 is formed of, for example, a polyimide resin or the like.

As illustrated in FIG. 3, the TFT layer 30 includes a base coat film 11 provided on the resin substrate 10, a plurality of first pixel TFTs 9a and a plurality of second pixel TFTs 9b (see FIG. 4) provided on the base coat film 11 as N-channel second pixel TFTs, a plurality of capacitors 9c (see FIG. 4) provided on the base coat film 11, and a protective insulating film 21 and a flattening film 22 provided sequentially on each of the first pixel TFTs 9a, each of the second pixel TFTs 9b, and each of the capacitors 9c. Here, as illustrated in FIG. 2, in the TFT layer 30, a plurality of gate lines 18g are provided extending parallel to each other in the X direction in the drawing. As illustrated in FIG. 2, in the TFT layer 30, a plurality of source lines 20h are provided extending in a direction intersecting (orthogonal to) the plurality of gate lines 18g, that is, parallel to each other in the Y direction in the drawing. Further, as illustrated in FIG. 2, in the TFT layer 30, a plurality of power source lines 20i are provided extending parallel to each other in the Y direction in the drawing. Then, as illustrated in FIG. 2, the power source lines 20i are provided adjacent to the source lines 20h, respectively. As illustrated in FIG. 4, in the TFT layer 30, each of the subpixels P includes the first pixel TFT 9a, the second pixel TFT 9b, and the capacitor 9c. Note that, as illustrated in FIG. 3, in the TFT layer 30, the base coat film 11, a first semiconductor film serving as a first semiconductor layer 12a described later, a first gate insulating film 13 provided as a third inorganic insulating film, a first metal film serving as a third gate electrode 14a described later and the like, a first interlayer insulating film 15 provided as a second inorganic insulating film, a second semiconductor film serving as a second semiconductor layer 16a described later and the like, second gate insulating films 17a and 17b provided as first inorganic insulating films, a second metal film serving as the gate lines 18g and the like, a second interlayer insulating film 19 provided as a fourth inorganic insulating film, a third metal film serving as the source line 20h, the power source line 20i, and the like, the protective insulating film 21, and the flattening film 22 are sequentially layered on the resin substrate 10.

The base coat film 11, the first gate insulating film 13, the first interlayer insulating film 15, the second gate insulating films 17a and 17b, the second interlayer insulating film 19, and the protective insulating film 21 are each formed, for example, by a single-layer inorganic insulating film of silicon nitride, silicon oxide, or silicon oxynitride, or a layered inorganic insulating film thereof. Here, at least a portion of the first interlayer insulating film 15 on the second semiconductor layer 16a side and a portion of each of the second gate insulating films 17a and 17b on the second semiconductor layer 16a side are formed of, for example, a silicon oxide film.

As illustrated in FIG. 4, the first pixel TFT 9a is electrically connected to the corresponding gate line 18g and source line 20h in each of the subpixels P. Further, as illustrated in FIG. 3, the first pixel TFT 9a includes the second semiconductor layer 16a provided on the first interlayer insulating film 15, a gate electrode 18a provided on the second semiconductor layer 16a with the second gate insulating film 17a interposed therebetween, and a second source electrode 20a and a second drain electrode 20b provided separated from each other on the second interlayer insulating film 19. Note that although the first pixel TFT 9a having a single gate structure is exemplified in the present embodiment, the first pixel TFT 9a may have a double gate structure as in the fifth peripheral TFT 9i described later.

The second semiconductor layer 16a is formed of a second semiconductor film made, for example, of an In—Ga—Zn—O based oxide semiconductor or the like, and includes, as illustrated in FIG. 3, a second source region 16aa and a second drain region 16ab defined separated from each other, and a second channel region 16ac defined between the second source region 16aa and the second drain region 16ab. Here, the In—Ga—Zn—O based semiconductor is a ternary oxide of indium (In), gallium (Ga) and zinc (Zn), and a ratio (composition ratio) of In, Ga, and Zn is not limited to any specific value. The In—Ga—Zn—O based semiconductor may be an amorphous semiconductor or may be a crystalline semiconductor. Note that as a crystalline In—Ga—Zn—O based semiconductor, a crystalline In—Ga—Zn—O based semiconductor in which the c-axis is oriented substantially perpendicular to the layer surface is preferable. In place of the In—Ga—Zn—O based semiconductor, another oxide semiconductor may be included. Examples of the other oxide semiconductor may include an In—Sn—Zn—O based semiconductor (for example, $In_2O_3$—$SnO_2$—ZnO; InSnZnO). Here, the In—Sn—Zn—O based semiconductor is a ternary oxide of indium (In), tin (Sn), and zinc (Zn). Alternatively, examples of the other oxide semiconductor may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), an Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_xZn_{1-x}O$), and cadmium zinc oxide ($Cd_xZn_{1-x}O$). Note that, as the Zn—O based semiconductor, a semiconductor in a non-crystalline (amorphous) state of ZnO to which one kind or a plurality of kinds of impurity elements among group 1 elements, group 13 elements, group 14 elements, group 15 elements, group 17 elements, and the like are added, a semiconductor in a polycrystalline state, a semiconductor in a microcrystalline state in which the non-crystalline state and the polycrystalline state are mixed, or a semiconductor to which no impurity element is added can be used.

As illustrated in FIG. 3, the gate electrode 18a is provided overlapping with the second channel region 16ac of the second semiconductor layer 16a, and is configured to control conduction between the second source region 16aa and the second drain region 16ab of the second semiconductor layer 16a. Similarly to the gate line 18g and the like, the gate electrode 18a is formed of the second metal film.

As illustrated in FIG. 3, the second source electrode 20a and the second drain electrode 20b are respectively electrically connected to the second source region 16aa and the second drain region 16ab of the second semiconductor layer 16a via contact holes formed in the second interlayer insulating film 19. Similarly to the source line 20h and the power source line 20i, the second source electrode 20a and the second drain electrode 20b are formed of the third metal film.

As illustrated in FIG. 4, the second pixel TFT 9b is electrically connected to the corresponding first pixel TFT 9a and power source line 20i in each of the subpixels P. Similarly to the first pixel TFT 9a described above, the second pixel TFT 9b includes the second semiconductor layer 16a, the gate electrode 18a, the second source electrode 20a, and the second drain electrode 20b.

As illustrated in FIG. 4, the capacitor 9c is electrically connected to the corresponding first pixel TFT 9a and power source line 20i in each of the subpixels P. Here, the capacitor 9c includes, for example, a lower conductive layer formed of the second metal film, an upper conductive layer formed of the third metal film, and the second interlayer insulating film 19 provided between the lower conductive layer and the upper conductive layer. Note that the upper conductive layer is electrically connected to the power source line 20i via a contact hole formed in the second interlayer insulating film 19.

The flattening film 22 includes a flat surface in the display region D, and is formed of an organic resin material or the like such as a polyimide resin, for example.

As illustrated in FIG. 3, the organic EL element layer 40 includes a plurality of organic EL elements 35 provided on the TFT layer 30 as a plurality of light-emitting elements arrayed in a matrix shape in correspondence with the plurality of subpixels P, respectively. Here, as illustrated in FIG. 3, the organic EL element 35 includes a first electrode 31 provided on the TFT layer 30, the organic EL layer 33 provided on the first electrode 31, and a second electrode 34 provided on the organic EL layer 33 and being common to the entire display region D.

The first electrode 31 is electrically connected to the second drain electrode 20b of the second pixel TFT 9b of each of the subpixels P via a contact hole formed in the protective insulating film 21 and the flattening film 22. The first electrode 31 functions to inject holes (positive holes) into the organic EL layer 33. The first electrode 31 is preferably formed of a material having a high work function to improve the efficiency of hole injection into the organic EL layer 33. Here, examples of the material forming the first electrode 31 include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of the material forming the first electrode 31 may include an alloy such as astatine (At)/astatine oxide ($AtO_2$). Further, examples of the material forming the first electrode 31 may include electrically conductive oxide such as tin oxide (SnO), zinc oxide (ZnO), indium tin oxide (ITO), and indium zinc oxide (IZO). Further, the first electrode 31 may be formed by layering a plurality of layers made of any of the materials described above. Note that examples of a compound material having a high work function include indium tin oxide (ITO) and indium zinc oxide (IZO). Further, a circumferential end portion of the first electrode 31 is covered with an edge cover 32 provided in a lattice pattern in the entire display region D. Here, the edge cover 32 is formed, for example, of an organic resin material such as a polyimide resin or an acrylic resin, or a polysiloxane-based spin-on-glass (SOG) material.

As illustrated in FIG. 5, the organic EL layer 33 includes a hole injection layer 1, a hole transport layer 2, a light-emitting layer 3, an electron transport layer 4, and an electron injection layer 5, which are sequentially layered on the first electrode 31.

The hole injection layer 1 is also referred to as an anode electrode buffer layer, and functions to reduce an energy level difference between the first electrode 31 and the organic EL layer 33, thus improving the efficiency of hole injection into the organic EL layer 33 from the first electrode 31. Here, examples of the material forming the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 31 to the organic EL layer 33. Here, examples of the material forming the hole transport layer 2 include porphyrin derivatives, aromatic tertiary amine compounds, styrylamine derivatives, polyvinylcarbazole, poly-p-phenylenevinylene, poly-silane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 31 and the second electrode 34, respectively, and the holes and the electrons recombine in a case where a voltage is applied by the first electrode 31 and the second electrode 34. Here, the light-emitting layer 3 is formed of a material having high luminous efficiency. Examples of the material forming the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 has a function of causing electrons to efficiently migrate to the light-emitting layer 3. Here, examples of the material forming the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 34 and the organic EL layer 33, thus improving the efficiency of electron injection into the organic EL layer 33 from the second electrode 34, and this function can reduce the drive voltage of the organic EL element 35. Note that the electron injection layer 5 is also referred to as a cathode electrode buffer layer. Here, examples of the material forming the electron injection layer 5 include inorganic alkaline compounds, such as lithium fluoride (LiF), magnesium fluoride (MgF$_2$), calcium fluoride (CaF$_2$), strontium fluoride (SrF$_2$), and barium fluoride (BaF$_2$); aluminum oxide (Al$_2$O$_3$); and strontium oxide (SrO).

As illustrated in FIG. 3, the second electrode 34 is provided covering each of the organic EL layer 33 and the edge cover 32. The second electrode 34 functions to inject electrons into the organic EL layer 33. The second electrode 34 is preferably formed of a material having a low work function to improve the efficiency of electron injection into the organic EL layer 33. Here, examples of the material forming the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be formed of an alloy such as magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), and lithium fluoride (LiF)/calcium (Ca)/aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers made of any of the materials described above. Note that examples of the material having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 45 is provided covering the second electrode 34, includes a first inorganic sealing film 41, an organic sealing film 42, and a second inorganic sealing film 43 that are sequentially layered on the second electrode 34, and has a function to protect the organic EL layer 33 of the organic EL element 35 from moisture, oxygen, and the like. Here, the first inorganic sealing film 41 and the second inorganic sealing film 43 are each formed, for example, of an inorganic insulating film such as a silicon nitride film, a silicon oxide film, and a silicon oxynitride film. Further, the organic sealing film 42 is formed, for example, of an organic resin material such as an acrylic resin, an epoxy resin, a silicone resin, a polyurea resin, a parylene resin, a polyimide resin, and a polyamide resin.

As illustrated in FIG. 6, the gate driver circuit M in the frame region F of the organic EL display device 50 (TFT layer 30) includes a flip-flop circuit A and the CMOS circuit C provided for each of the gate lines 18g.

As illustrated in FIG. 6, the flip-flop circuit A includes a first peripheral TFT 9e, a second peripheral TFT 9f, and a third peripheral TFT 9g that are provided as P-channel first TFTs, and one capacitor 9j, and is configured to output, to a node N1, a gate signal shifted from a clock signal CK by a half cycle as a result of the clock signal CK and an inverted clock signal CKB being input so as to intersect each other.

Similarly to the fourth peripheral TFT 9h described later, each of the first peripheral TFT 9e, the second peripheral TFT 9f, and the third peripheral TFT 9g includes the first semiconductor layer 12a, the third gate electrode 14a, a first source electrode 20c, and a first drain electrode 20d.

As illustrated in FIG. 6, the clock signal is input to the gate electrode (third gate electrode 14a) of the first peripheral TFT 9e, the source electrode (first source electrode 20c) of the first peripheral TFT 9e is electrically connected to a power source line of a high-level voltage VDD, and the drain electrode (first drain electrode 20d) of the first peripheral TFT 9e is electrically connected to the node N1.

As illustrated in FIG. 6, the gate electrode (third gate electrode 14a) of the second peripheral TFT 9f is electrically connected to a node N2, the inverted clock signal CKB is input to the source electrode (first source electrode 20c) of the second peripheral TFT 9f, and the drain electrode (first drain electrode 20d) of the second peripheral TFT 9f is electrically connected to the node N1.

As illustrated in FIG. 6, the clock signal is input to the gate electrode (third gate electrode 14a) of the third peripheral TFT 9g, a start pulse SU is input to the source electrode (first source electrode 20c) of the third peripheral TFT 9g, and the drain electrode (first drain electrode 20d) of the third peripheral TFT 9g is electrically connected to the node N2. Here, the start pulse SU is applied when the flip-flop circuit A is at the initial stage, namely, at the first stage, and when the flip-flop circuit A is at the subsequent stage, namely, at the second stage, a gate signal output at the first stage is input instead of the start pulse SU. Thus, at subsequent stages, a gate signal of the preceding stage is input to the source electrode (first source electrode 20c) of the third peripheral TFT 9g of the flip-flop circuit A.

As illustrated in FIG. 6, the capacitor 9j is coupled between the nodes N1 and N2, and is configured to maintain a voltage between the first drain electrode 20d and the third gate electrode 14a in the second peripheral TFT 9f.

As illustrated in FIGS. 6 and 7, the CMOS circuit C includes the fourth peripheral TFT 9h provided as a P-channel first TFT and the fifth peripheral TFT 9i provided as an N-channel second TFT, and is configured such that when a gate signal input from a node N3 has the same potential as that of a low-level voltage VSS, the fourth peripheral TFT 9h is turned on, the fifth peripheral TFT 9i is turned off, and the same potential as that of the high-level voltage VDD is output from a node N4, and when the gate signal input from the node N3 has the same potential as that of the high-level voltage VDD, the fourth peripheral TFT 9h is turned off, the fifth peripheral TFT 9i is turned on, and the same potential as that of the low-level voltage VSS is output from the node N4. Note that the node N3 of the CMOS circuit C is electrically connected to the node N1 of the flip-flop circuit A.

As illustrated in FIG. 6, the gate electrode (third gate electrode 14a) of the fourth peripheral TFT 9h is electrically connected to the node N3, the source electrode (first source electrode 20c) of the fourth peripheral TFT 9h is electrically connected to the power source line of the high-level voltage VDD, and the drain electrode (first drain electrode 20d) of the fourth peripheral TFT 9h is electrically connected to the node N4. Further, as illustrated in FIG. 7, the fourth peripheral TFT 9h includes the first semiconductor layer 12a provided on the base coat film 11, the third gate electrode 14a provided on the side of the first semiconductor layer 12a, opposite to the resin substrate 10 with the first gate insulating film 13 interposed therebetween, and the first source electrode 20c and the first drain electrode 20d provided separated from each other on the second interlayer insulating film 19.

The first semiconductor layer 12a is formed of, for example, polysilicon such as low temperature polysilicon (LTPS), and as illustrated in FIG. 7, includes a first source region 12aa and a first drain region 12ab defined separated from each other, and a first channel region 12ac defined between the first source region 12aa and the first drain region 12ab.

As illustrated in FIG. 7, the third gate electrode 14a is provided overlapping with the first channel region 12ac of the first semiconductor layer 12a, and is configured to control conduction between the first source region 12aa and the first drain region 12ab of the first semiconductor layer 12a. The third gate electrode 14a is formed of the same material and in the same layer as a second gate electrode 14b, and is formed of the first metal film as described above.

As illustrated in FIG. 7, the first source electrode 20c and the first drain electrode 20d are respectively electrically connected to the first source region 12aa and the first drain region 12ab of the first semiconductor layer 12a via contact holes formed in the first gate insulating film 13, the first interlayer insulating film 15, and the second interlayer insulating film 19. Similarly to the source line 20h, the power source line 20i, and the like, the first source electrode 20c and the first drain electrode 20d are formed of the third metal film.

As illustrated in FIG. 6, the gate electrodes (a first gate electrode 18b and the second gate electrode 14b) of the fifth peripheral TFT 9i are electrically connected to the node N3, the source electrode (second source electrode 20e) of the fifth peripheral TFT 9i is electrically connected to the power source line of the low-level voltage VSS, and the drain electrode (second drain electrode 20f) of the fifth peripheral TFT 9i is electrically connected to the node N4. Further, as illustrated in FIG. 7, the fifth peripheral TFT 9i includes the second semiconductor layer 16b provided on the first interlayer insulating film 15, the first gate electrode 18b provided on the side of the second semiconductor layer 16b, opposite to the resin substrate 10 with the second gate insulating film 17b interposed therebetween, the second gate electrode 14b provided on the resin substrate 10 side of the second semiconductor layer 16b with the first interlayer insulating film 15 interposed therebetween, and a second source electrode 20e and a second drain electrode 20f provided separated from each other on the second interlayer insulating film 19. Furthermore, as illustrated in FIG. 8, the fifth peripheral TFT 9i is configured to apply a negative voltage (for example, Vbg=−5 to −4 V) to the second gate electrode 14b during an off period (Vtg=0 V) in which no voltage (Vtg) is applied to the first gate electrode 18b, so that hot carriers are not accumulated during the off period. Note that, in FIG. 8, Vd is a voltage applied between the second source electrode 20e and the second drain electrode 20f. As illustrated in FIG. 8, the fifth peripheral TFT 9i is configured to apply the voltage of 0 V (Vbg=0 V) to the second gate electrode 14b during an on period (for example, Vtg=+40 to +50 V) in which a voltage (Vtg) is applied to the first gate electrode 18b.

Similarly to the second semiconductor layer 16a, the second semiconductor layer 16b is formed of a second semiconductor film made, for example, of an In—Ga—Zn—O based oxide semiconductor or the like, and includes, as illustrated in FIG. 7, a second source region 16ba and a second drain region 16bb defined separated from each other, and a second channel region 16bc defined between the second source region 16ba and the second drain region 16bb.

As illustrated in FIG. 7, the first gate electrode 18*b* is provided overlapping with the second channel region 16*bc* of the second semiconductor layer 16*b*, and is configured to control conduction between the second source region 16*ba* and the second drain region 16*bb* of the second semiconductor layer 16*b*. Similarly to the gate line 18*g* and the like, the first gate electrode 18*b* is formed of the second metal film.

As illustrated in FIG. 7, the second gate electrode 14*b* is provided overlapping with the second channel region 16*bc* of the second semiconductor layer 16*b*, and is configured to control conduction between the second source region 16*ba* and the second drain region 16*bb* of the second semiconductor layer 16*b*. Similarly to the third gate electrode 14*a*, the second gate electrode 14*b* is formed of the first metal film.

As illustrated in FIG. 7, the second source electrode 20*e* and the second drain electrode 20*f* are respectively electrically connected to the second source region 16*ba* and the second drain region 16*bb* of the second semiconductor layer 16*b* via contact holes formed in the second interlayer insulating film 19. Similarly to the source line 20*h*, the power source line 20*i*, and the like, the second source electrode 20*e* and the second drain electrode 20*f* are formed of the third metal film.

Here, an operation of the gate driver circuit M (the flip-flop circuit A and the CMOS circuit C) will be described.

In the flip-flop circuit A, for example, when the clock signal CK is at a low level, the inverted clock signal CKB is at a high level, and the start pulse SU is at the low level, the first peripheral TFT 9*e* and the third peripheral TFT 9*g* are turned on. At this time, although the low-level start pulse SU is input to the third gate electrode 14*a* of the second peripheral TFT 9*f* and the second peripheral TFT 9*f* is turned on, since the high-level inverted clock signal CKB is applied to the first source electrode 20*c* of the second peripheral TFT 9*f*, no current flows through the second peripheral TFT 9*f*. Therefore, a high-level gate signal is output to the node N1. Subsequently, the high-level gate signal output from the node N1 is input to the node N3, and since this gate signal has the same potential as that of the high-level voltage VDD, the fourth peripheral TFT 9*h* is turned off, the fifth peripheral TFT 9*i* is turned on, and a gate signal having the same potential as that of the low-level voltage VSS is output from the node N4.

Next, in the flip-flop circuit A, for example, when the clock signal CK is at the high level, the inverted clock signal CKB is at the low level, and the start pulse SU is at the high level, the first peripheral TFT 9*e* and the third peripheral TFT 9*g* are turned off. At this time, since the low-level inverted clock signal CKB is input to the first source electrode 20*c* of the second peripheral TFT 9*f*, the second peripheral TFT 9*f* is turned on. Then, a current flows through the second peripheral TFT 9*f* due to a high-level voltage stored in the node N1, and the voltage of the node N1 decreases by an amount corresponding to the low-level inverted clock signal CKB. This is because, since the node N2, to which one terminal of the capacitor 9*j* is connected, is brought into a floating state as a result of the third peripheral TFT 9*g* being turned off, the voltage of the node N2 decreases by an amount corresponding to the decrease in the voltage of the node N1, thereby enabling full-down. Therefore, a low-level gate signal is output to the node N1. Subsequently, the low-level gate signal output from the node N1 is input to the node N3, and when this gate signal has the same potential as that of the low-level voltage VSS, the fourth peripheral TFT 9*h* is turned on, the fifth peripheral TFT 9*i* is turned off, and a gate signal having the same potential as that of the high-level voltage VDD is output from the node N4.

In the organic EL display device 50 described above, in each of the subpixels P, a gate signal is input to the first pixel TFT 9*a* via the gate line 18*g* to turn on the first pixel TFT 9*a*, a data signal is written in the gate electrode 18*a* of the second pixel TFT 9*b* and the capacitor 9*c* via the source line 20*h*, and a current from the power source line 20*i* corresponding to a gate voltage of the second pixel TFT 9*b* is supplied to the organic EL layer 33. As a result, in each of the subpixels P, the light-emitting layer 3 of the organic EL layer 33 emits light to cause the organic EL display device 50 to display an image. Note that, in the organic EL display device 50*a*, even when the first pixel TFT 9*a* is turned off, the gate voltage of the second pixel TFT 9*b* is held by the capacitor 9*c*, and thus light emission by the light-emitting layer 3 is maintained until a gate signal of the next frame is input.

Next, a method of manufacturing the organic EL display device 50 according to the present embodiment will be described. Here, the method of manufacturing the organic EL display device 50 according to the present embodiment includes a TFT layer forming step, an organic EL element layer forming step, and a sealing film forming step.

TFT Layer Forming Step

First, a silicon nitride film (having a thickness of about 50 nm) and a silicon oxide film (having a thickness of about 250 nm) are sequentially formed on the resin substrate 10 formed on a glass substrate by, for example, plasma chemical vapor deposition (CVD), to form the base coat film 11.

Subsequently, an amorphous silicon film (having a thickness of about 50 nm) is formed, for example, by plasma CVD on the substrate surface on which the base coat film 11 is formed, the amorphous silicon film is crystallized by laser annealing or the like to form the first semiconductor film made of polysilicon, and then the first semiconductor film is patterned to form the first semiconductor layer 12*a* and the like.

After that, a silicon oxide film (having a thickness of about 100 nm) is formed, for example, by plasma CVD on the substrate surface on which the first semiconductor layer 12*a* and the like are formed, to form the first gate insulating film 13.

Further, after forming a first metal film made of a molybdenum film or the like (having a thickness of about 200 nm) on the substrate surface on which the first gate insulating film 13 is formed, for example, by sputtering, the first metal film is patterned to form the third gate electrode 14*a*, the second gate electrode 14*b*, and the like.

Subsequently, by doping the first semiconductor layer 12*a* with impurity ions using the third gate electrode 14*a* as a mask, a part of the first semiconductor layer 12*a* is made conductive, and the first source region 12*aa*, the first drain region 12*ab*, and the first channel region 12*ac* are formed in the first semiconductor layer 12*a*.

After that, a silicon nitride film (having a thickness of about 150 nm) and a silicon oxide film (having a thickness of about 100 nm) are sequentially formed, for example, by plasma CVD, on the substrate surface on which the part of the first semiconductor layer 12*a* is made conductive, to form the first interlayer insulating film 15.

Further, after forming a second semiconductor film made of an oxide semiconductor such as an InGaZnO$_4$ film (having a thickness of about 30 nm) on the substrate surface on which the first interlayer insulating film 15 is formed, for example, by sputtering, the second semiconductor film is patterned to form the second semiconductor layers 16*a* and 16*b*.

Subsequently, after forming a silicon oxide film (having a thickness of about 100 nm) on the substrate surface on which the second semiconductor layer 16*a* and the like are formed, for example, by plasma CVD, a second metal film made of a molybdenum film (having a thickness of about 200 nm) is formed, for example, by sputtering. After that, the second metal film is patterned to form the gate electrode 18*a*, the first gate electrode 18*b*, the gate line 18*g*, and the like.

After that, the silicon oxide film exposed from the gate electrode 18*a*, the first gate electrode 18*b*, and the gate line 18*g* is etched to form the second gate insulating films 17*a* and 17*b*, and the like.

Further, on the substrate surface on which the second gate insulating films 17*a* and 17*b* and the like are formed, a silicon oxide film (having a thickness of about 300 nm) and a silicon nitride film (having a thickness of about 150 nm) are sequentially formed, for example, by plasma CVD to form the second interlayer insulating film 19. Note that, by performing heat treatment after forming the second interlayer insulating film 19, a part of each of the second semiconductor layers 16*a* and 16*b* is made conductive, the second source region 16*aa*, the second drain region 16*ab*, and the second channel region 16*ac* are formed on the second semiconductor layer 16*a*, and also the second source region 16*ba*, the second drain region 16*bb*, and the second channel region 16*bc* are formed on the second semiconductor layer 16*b*.

Subsequently, on the substrate surface on which the second interlayer insulating film 19 is formed, the first gate insulating film 13, the first interlayer insulating film 15, and the second interlayer insulating film 19 are appropriately patterned to form a contact hole.

After that, a titanium film (having a thickness of about 50 nm), an aluminum film (having a thickness of about 400 nm), a titanium film (having a thickness of about 100 nm), and the like are sequentially formed, for example, by sputtering on the substrate surface on which the above-described contact hole is formed, to form a third metal film. After that, the third metal film is patterned to form the second source electrode 20*a*, the second drain electrode 20*b*, the first source electrode 20*c*, the first drain electrode 20*d*, the second source electrode 20*e*, the second drain electrode 20*f*, the source line 20*h*, the power source line 20*i*, and the like.

Further, a silicon oxide film (having a thickness of about 250 nm) is formed on the substrate surface on which the second source electrode 20*a* and the like are formed, for example, by plasma CVD to form the protective insulating film 21.

Subsequently, an acrylic photosensitive resin film (having a thickness of about 2 μm) is applied to the substrate surface on which the protective insulating film 21 is formed, for example, by a spin coating method or a slit coating method, and then, pre-baking, exposing, developing, and post-baking are performed on the applied film to form the flattening film 22 including a contact hole.

Finally, the protective insulating film 21 exposed from the contact hole of the flattening film 22 is removed so that the contact hole reaches the second drain electrode 20*b* of the second pixel TFT 9*b*.

As described above, the TFT layer 30 can be formed.

Organic EL Element Layer Forming Step

The organic EL element layer 40 is formed, using a known method, by forming the first electrodes 31, the edge cover 32, the organic EL layer 33 (the hole injection layer 1, the hole transport layer 2, the light-emitting layer 3, the electron transport layer 4, and the electron injection layer 5), and the second electrode 34, on the flattening film 22 of the TFT layer 30 that is formed at the TFT layer forming step described above.

Sealing Film Forming Step

First, for example, an inorganic insulating film such as a silicon nitride film, a silicon oxide film, or a silicon oxynitride film is formed by plasma CVD on the substrate surface on which the organic EL element layer 40 is formed at the organic EL element layer forming step described above, by using a mask to form the first inorganic sealing film 41.

Subsequently, a film made of an organic resin material such as acrylic resin is formed on the substrate surface on which the first inorganic sealing film 41 is formed, for example, by an ink-jet method to form the organic sealing film 42.

Further, an inorganic insulating film such as a silicon nitride film, a silicon oxide film, or a silicon oxynitride film is formed by plasma CVD on the substrate on which the organic sealing film 42 is formed, by using a mask to form the second inorganic sealing film 43, thereby forming the sealing film 45.

Finally, after a protective sheet (not illustrated) is attached to the substrate surface on which the sealing film 45 is formed, the glass substrate is peeled off from the lower face of the resin substrate 10 by irradiation with laser light from the glass substrate side of the resin substrate 10, and further a protective sheet (not illustrated) is attached to the lower face of the resin substrate 10 from which the glass substrate has been peeled off.

The organic EL display device 50 of the present embodiment can be manufactured in the manner described above.

Figure 9:
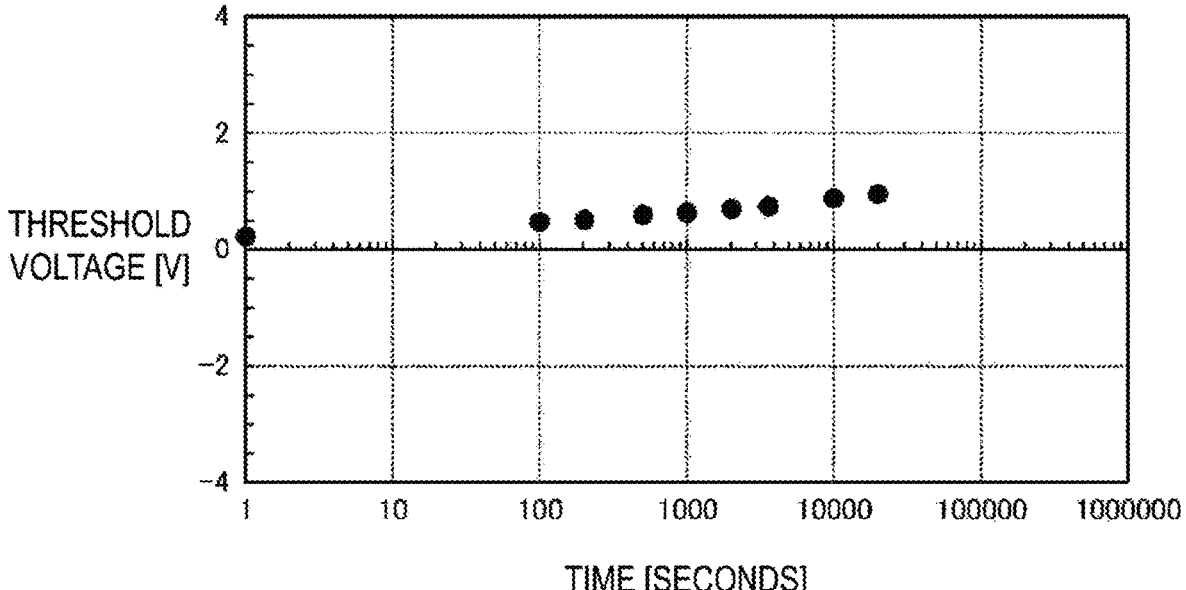
FIG. 9 is a graph showing changes in a threshold voltage in an on state when a stress test is performed as Comparative Example in the second thin film transistor included in the complementary metal oxide film semiconductor circuit of the organic EL display device according to the first embodiment of the disclosure.
Figure 10:
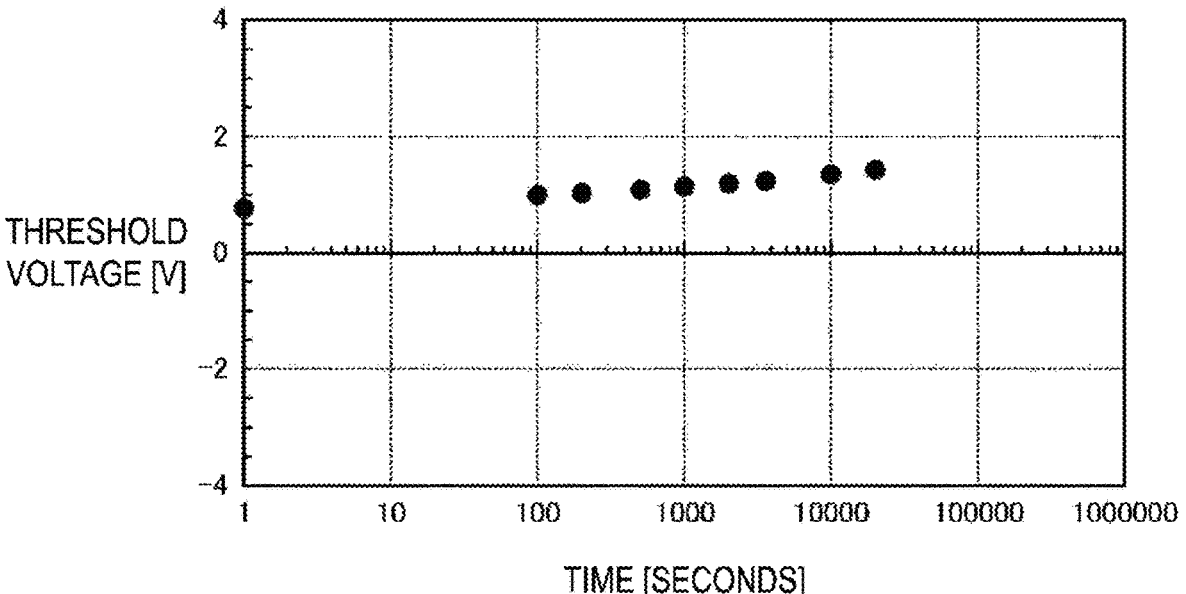
FIG. 10 is a graph showing changes in the threshold voltage in the on state when the stress test is performed as Example in the second thin film transistor included in the complementary metal oxide film semiconductor circuit of the organic EL display device according to the first embodiment of the disclosure.
Figure 11:
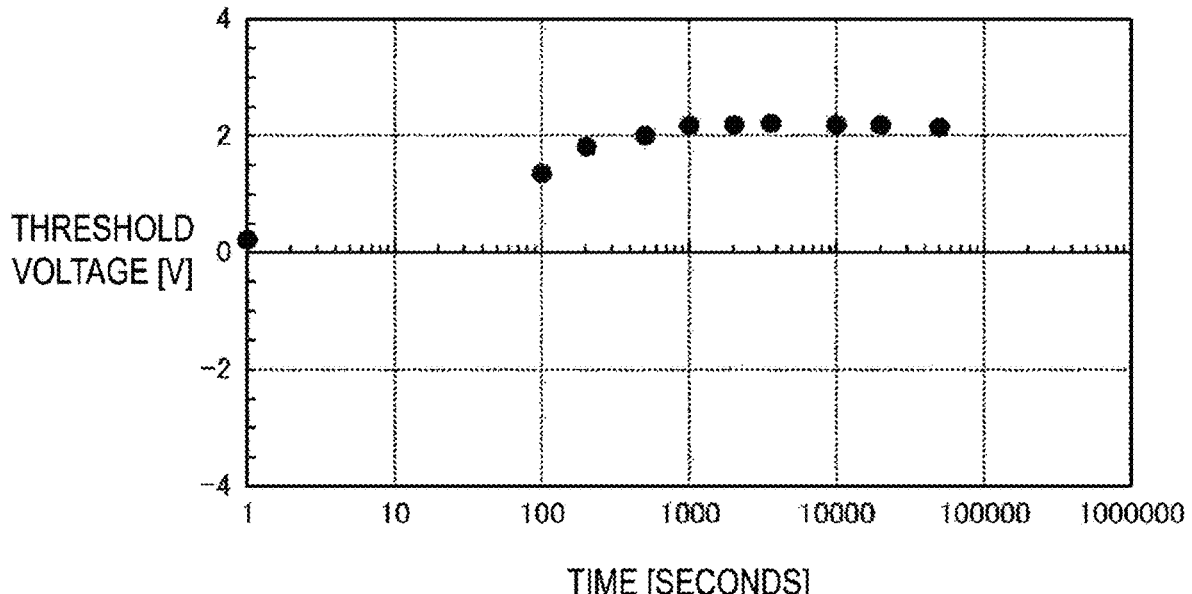
FIG. 11 is a graph showing changes in the threshold voltage in an off state when the stress test is performed as Comparative Example in the second thin film transistor included in the complementary metal oxide film semiconductor circuit of the organic EL display device according to the first embodiment of the disclosure.
Figure 12:
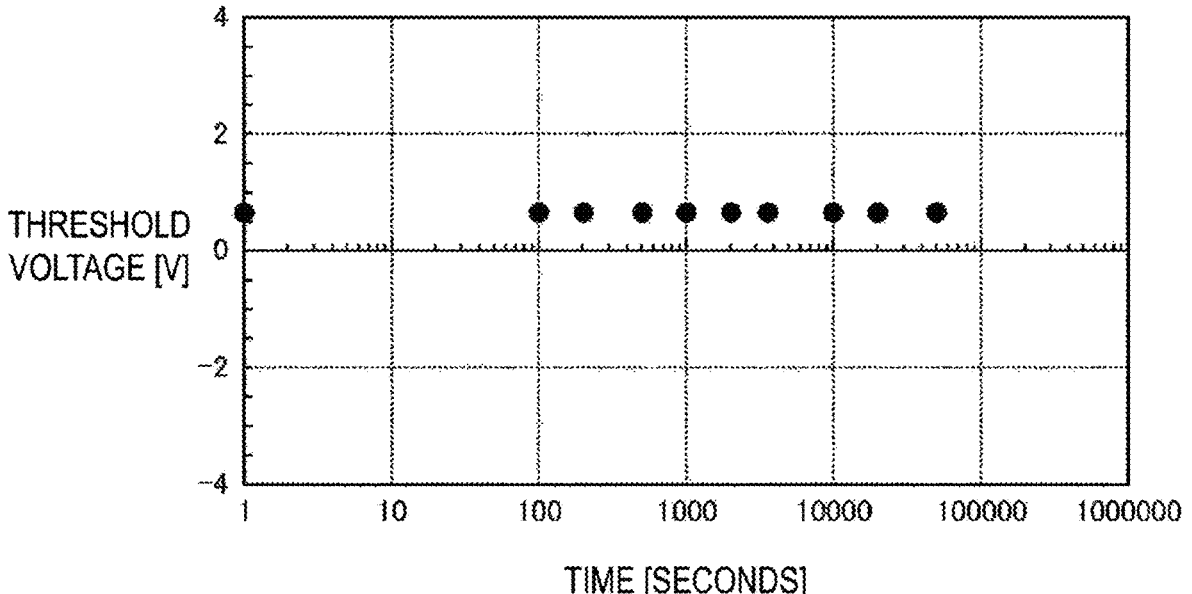
FIG. 12 is a graph showing changes in the threshold voltage in the off state when the stress test is performed as Example in the second thin film transistor included in the complementary metal oxide film semiconductor circuit of the organic EL display device according to the first embodiment of the disclosure.

Next, an experiment (stress test) specifically performed on the fifth peripheral TFT 9*i* included in the CMOS circuit C of the organic EL display device 50 of the present embodiment will be described. Here, FIGS. 9 and 10 are graphs showing changes in a threshold voltage in the on state when stress tests are performed on the fifth peripheral TFT 9*i* included in the CMOS circuit C, as Comparative Example and Example. Further, FIGS. 11 and 12 are graphs showing changes in the threshold voltage in the off state when stress tests are performed on the fifth peripheral TFT 9*i* included in the CMOS circuit C of the organic EL display device 50, as Comparative Example and Example.

In actuality, as illustrated in FIG. 8, the fifth peripheral TFT 9*i* is driven by an on/off pulse-shaped voltage waveform, but in this stress test, in order to emphasize the relative merits/demerits of Example and Comparative Example, the relative merits/demerits of changes in the characteristics of the fifth peripheral TFT 9*i* were evaluated by applying a voltage to the fifth peripheral TFT 9*i* in the on state and in the off state, separately, and measuring the changes in the threshold voltage over time.

Specifically, in the on-state stress test, the changes in the threshold voltage were measured in a state where the voltage of +50 V was applied to the first gate electrode 18*b*, the voltage of 0 V was applied between the second source electrode 20*e* and the second drain electrode 20*f*, the voltage of 0 V was applied to the second gate electrode 14*b* in Example, and no voltage was applied to the second gate electrode 14*b* in Comparative Example.

Further, in the off-state stress test, the changes in the threshold voltage were measured in a state where the voltage of 0 V was applied to the first gate electrode 18*b*, the voltage of +50 V was applied between the second source electrode 20*e* and the second drain electrode 20*f*, the voltage of −5 V was applied to the second gate electrode 14*b* in Example, and no voltage was applied to the second gate electrode 14*b* in Comparative Example.

As a result of the experiment, in the on state, the threshold voltage was stable even after a long time in both Comparative Example (FIG. 9) and Example (FIG. 10). In the off state, the threshold voltage changed within a short time in Comparative Example as shown in FIG. 11, and the threshold voltage was stable even after a long time in Example as shown in FIG. 12. From this, it was found that a deterioration in the characteristics of the fifth peripheral TFT 9*i* in the off state was suppressed by applying a negative voltage to the second gate electrode 14*b* of the fifth peripheral TFT 9*i* in the off state.

As described above, according to the organic EL display device 50 of the present embodiment, the N-channel fifth peripheral TFT 9*i* included in the CMOS circuit C provided as a part of the gate driver circuit M includes the second semiconductor layer 16*b* formed of the oxide semiconductor, the first gate electrode 18*b* provided on the side of the second semiconductor layer 16*b*, opposite to the resin substrate 10 with the second gate insulating film 17*b* interposed therebetween, and the second gate electrode 14*b* provided on the resin substrate 10 side of the second semiconductor layer 16*b* with the first interlayer insulating film 15 interposed therebetween. Here, since the fifth peripheral TFT 9*i* is configured to apply a negative voltage to the second gate electrode 14*b* during the off period in which no voltage is applied to the first gate electrode 18*b*, even if the voltage applied between the second source electrode 20*e* and the second drain electrode 20*f* during the off period is high, generation (accumulation) of hot carriers is suppressed, and the drain current (off-state current) can be reduced. As a result, it is possible to suppress the deterioration in the characteristics in the off state of the N-channel fifth peripheral TFT 9*i* that uses the oxide semiconductor.

Second Embodiment

Figure 13:
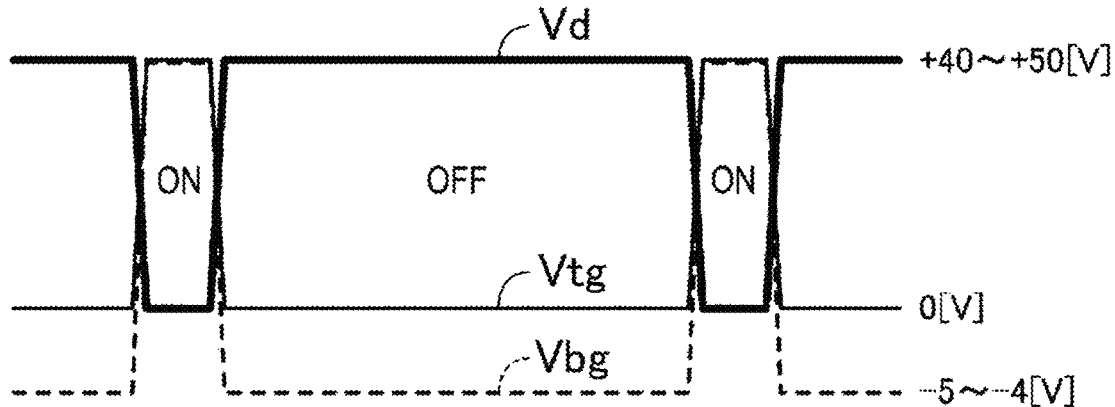
FIG. 13 is a voltage waveform diagram illustrating a driving operation of a second thin film transistor included in a complementary metal oxide film semiconductor circuit of an organic EL display device according to a second embodiment of the disclosure.

FIG. 13 illustrates a second embodiment of a display device according to the disclosure. Here, FIG. 13 is a voltage waveform diagram illustrating a driving operation of the fifth peripheral TFT 9*i* included in the CMOS circuit C of an organic EL display device according to the present embodiment. Note that, in the following embodiment, portions identical to those in FIGS. 1 to 12 will be denoted by the same reference signs, and detailed descriptions thereof will be omitted.

In the first embodiment described above, the organic EL display device 50 is exemplified that is configured to apply the voltage of 0 V to the second gate electrode 14*b* during the on period in the fifth peripheral TFT 9*i*, but in the present embodiment, an organic EL display device is exemplified that is configured to apply a positive voltage to the second gate electrode 14*b* during the on period in the fifth peripheral TFT 9*i*.

Since the organic EL display device of the present embodiment is substantially the same as the organic EL display device 50 of the first embodiment, except that the driving operation of the fifth peripheral TFT 9*i* is different from that of the first embodiment, the driving operation of the fifth peripheral TFT 9*i* will be mainly described below.

As in the first embodiment described above, the gate electrodes (the first gate electrode 18*b* and the second gate electrode 14*b*) of the fifth peripheral TFT 9*i* are electrically connected to the node N3, the source electrode (second source electrode 20*e*) of the fifth peripheral TFT 9*i* is electrically connected to the power source line of the low-level voltage VSS, and the drain electrode (second drain electrode 20*f*) of the fifth peripheral TFT 9*i* is electrically connected to the node N4. Further, as in the first embodiment described above, the fifth peripheral TFT 9*i* includes the second semiconductor layer 16*b* provided on the first interlayer insulating film 15, the first gate electrode 18*b* provided on the side of the second semiconductor layer 16*b*, opposite to the resin substrate 10 with the second gate insulating film 17*b* interposed therebetween, the second gate electrode 14*b* provided on the resin substrate 10 side of the second semiconductor layer 16*b* with the first interlayer insulating film 15 interposed therebetween, and the second source electrode 20*e* and the second drain electrode 20*f* provided separated from each other on the second interlayer insulating film 19. Further, as illustrated in FIG. 13, the fifth peripheral TFT 9*i* is configured to apply a negative voltage (for example, Vbg=−5 to −4 V) to the second gate electrode 14*b* during the off period (Vtg=0 V) in which no voltage (Vtg) is applied to the first gate electrode 18*b*, so that hot carriers are not accumulated during the off period. Further, as illustrated in FIG. 13, the fifth peripheral TFT 9*i* is configured to apply a positive voltage (for example, Vbg=+ 40 to +50 V) to the second gate electrode 14*b* during the on period (for example, Vtg=+40 to +50 V) in which the voltage (Vtg) is applied to the first gate electrode 18*b*. Here, the positive voltage applied to the second gate electrode 14*b* during the on period of the fifth peripheral TFT 9*i* has the same potential as that of the positive voltage applied to the first gate electrode 18*b* during the on period.

Similarly to the organic EL display device 50 of the first embodiment described above, the organic EL display device of the present embodiment is flexible and is configured to display an image by causing the light-emitting layer 3 of the organic EL layer 33 to appropriately emit light through the first pixel TFT 9*a* and the second pixel TFT 9*b* in each of the subpixels P.

As described above, according to the organic EL display device of the present embodiment, the N-channel fifth peripheral TFT 9*i* included in the CMOS circuit C provided as a part of the gate driver circuit M includes the second semiconductor layer 16*b* formed of the oxide semiconductor, the first gate electrode 18*b* provided on the side of the second semiconductor layer 16*b*, opposite to the resin substrate 10 with the second gate insulating film 17*b* interposed therebetween, and the second gate electrode 14*b* provided on the resin substrate 10 side of the second semiconductor layer 16*b* with the first interlayer insulating film 15 interposed therebetween. Here, since the fifth peripheral TFT 9*i* is configured to apply a negative voltage to the second gate electrode 14*b* during the off period in which no voltage is applied to the first gate electrode 18*b*, even if the voltage applied between the second source electrode 20*e* and the second drain electrode 20*f* during the off period is high, generation (accumulation) of hot carriers is suppressed, and the drain current (off-state current) can be reduced. As a result, it is possible to suppress the deterioration in the characteristics in the off state of the N-channel fifth peripheral TFT 9*i* that uses the oxide semiconductor.

Further, according to the organic EL display device of the present embodiment, since the N-channel fifth peripheral TFT 9*i* included in the CMOS circuit C is configured to apply a positive voltage having the same potential as that of the first gate electrode 18*b* to the second gate electrode 14*b* during the on period in which the voltage is applied to the first gate electrode 18*b*, an on-state current of the fifth peripheral TFT 9*i* can be increased.

Other Embodiments

Although the organic EL layer having a five-layer structure including the hole injection layer, the hole transport layer, the light-emitting layer, the electron transport layer, and the electron injection layer has been exemplified in each of the embodiments described above, the organic EL layer may have a three-layer structure including a hole injection-cum-transport layer, a light-emitting layer, and an electron transport-cum-injection layer, for example.

In each of the embodiments described above, the organic EL display device including the first electrode as an anode electrode and the second electrode as a cathode electrode is exemplified. The disclosure is also applicable to an organic EL display device in which the layered structure of the organic EL layer is reversed with the first electrode being a cathode electrode and the second electrode being an anode electrode.

Although the organic EL display device in which the electrode of the TFT connected to the first electrode serves as the drain electrode has been exemplified in each of the embodiments described above, disclosure is also applicable to an organic EL display device in which the electrode of the TFT connected to the first electrode is referred to as the source electrode.

In each of the embodiments described above, the organic EL display device is exemplified as a display device. The disclosure can also be applied to a display device including a plurality of light-emitting elements driven by a current, for example, to a display device including quantum dot light-emitting diodes (QLEDs), which are a light-emitting element that uses a quantum dot-containing layer.

INDUSTRIAL APPLICABILITY

As described above, the disclosure is useful for a flexible display device.

The invention claimed is:

1. A display device comprising:
   a base substrate; and
   a thin film transistor layer provided on the base substrate, the thin film transistor layer comprising:
   a first thin film transistor formed of polysilicon and including a first semiconductor layer, and
   a second thin film transistor formed of an oxide semiconductor and including a second semiconductor layer,
   wherein a display region, in which an image is displayed, and a frame region surrounding the display region are provided,
   a complementary metal oxide film semiconductor circuit, obtained by combining the first thin film transistor and the second thin film transistor, is provided in the frame region as a part of a drive circuit,
   the second thin film transistor in the complementary metal oxide film semiconductor circuit includes:

a first gate electrode provided on one surface side of the second semiconductor layer with a first inorganic insulating film interposed between the first gate electrode and the second semiconductor layer, and
   a second gate electrode provided on another surface side of the second semiconductor layer with a second inorganic insulating film interposed between the second gate electrode and the second semiconductor layer,
   during an OFF period of the second thin film transistor, a first voltage is applied to the first gate electrode and a second voltage is applied to the second gate electrode, the second voltage being lower than the first voltage, and
   during an ON period of the second thin film transistor, a third voltage is applied to the second gate electrode, the third voltage being higher than the second voltage.

2. The display device according to claim 1,
   wherein during the ON period of the second thin film transistor, the third voltage is higher than the first voltage.

3. The display device according to claim 2,
   wherein during the ON period of the second thin film transistor, a fourth voltage is applied to the first gate electrode, the fourth voltage being the same as the third voltage.

4. The display device according to claim 1,
   wherein the one surface side of the second semiconductor layer is opposite the base substrate, and
   the other surface side of the second semiconductor layer is facing the base substrate.

5. The display device according to claim 4,
   wherein the first thin film transistor further includes a third gate electrode provided on a side of the first semiconductor layer, opposite the base substrate, with a third inorganic insulating film interposed between the third gate electrode and the first semiconductor layer, and
   the third gate electrode is formed of the same material as a material of the second gate electrode and in the same layer as a layer of the second gate electrode.

6. The display device according to claim 5,
   wherein, in the thin film transistor layer, a first semiconductor film made of polysilicon, the third inorganic insulating film, a first metal film, the second inorganic insulating film, a second semiconductor film made of an oxide semiconductor, the first inorganic insulating film, a second metal film, a fourth inorganic insulating film, and a third metal film are sequentially layered in this stated order,
   the first semiconductor layer is formed of the first semiconductor film,
   the second semiconductor layer is formed of the second semiconductor film,
   the first gate electrode is formed of the second metal film, and
   the second gate electrode and the third gate electrode are formed of the first metal film.

7. The display device according to claim 6,
   wherein the first thin film transistor further includes a first source electrode and a first drain electrode that are formed of the third metal film, and
   the second thin film transistor further includes a second source electrode and a second drain electrode that are formed of the third metal film.

8. The display device according to claim 1, wherein each of a plurality of subpixels, included in the display region, includes a plurality of pixel thin film transistors as the second thin film transistor.

9. The display device according to claim 1, further comprising:

a light-emitting element layer provided on the thin film transistor layer and including a plurality of light-emitting elements arrayed in correspondence with a plurality of subpixels included in the display region; and a sealing film provided on the light-emitting element layer.

10. The display device according to claim 9, wherein each of the plurality of light-emitting elements is an organic electroluminescence element.

11. The display device according to claim 1, wherein the third voltage is the same as the first voltage.

\* \* \* \* \*